(12) United States Patent
Fu

(10) Patent No.: US 9,521,739 B2
(45) Date of Patent: Dec. 13, 2016

(54) PRINTED CIRCUIT BOARD AND DESIGN METHOD THEREOF

(71) Applicant: SHENZHEN CHINA STAR OPTOELECTRONICS TECHNOLOGY CO., LTD., Guangdong (CN)

(72) Inventor: Jianyong Fu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 93 days.

(21) Appl. No.: 14/394,477

(22) PCT Filed: Aug. 27, 2014

(86) PCT No.: PCT/CN2014/085300
§ 371 (c)(1),
(2) Date: Oct. 15, 2014

(87) PCT Pub. No.: WO2016/026161
PCT Pub. Date: Feb. 25, 2016

(65) Prior Publication Data
US 2016/0050747 A1  Feb. 18, 2016

(30) Foreign Application Priority Data
Aug. 8, 2014 (CN) .......................... 2014 1 0407289

(51) Int. Cl.
*H05K 1/02* (2006.01)
*H01R 4/34* (2006.01)
(Continued)

(52) U.S. Cl.
CPC .............. *H05K 1/0215* (2013.01); *H01R 4/34* (2013.01); *H05K 1/0216* (2013.01); *H01R 4/64* (2013.01);
(Continued)

(58) Field of Classification Search
CPC ...... H05K 1/0215; H05K 3/0005; H05K 1/09; H05K 2201/0355; H05K 1/0216; H05K 1/0284; H05K 1/11; H05K 1/111; H05K 1/112; H05K 1/113; H05K 1/115; H05K 1/02; H01R 4/66; H01R 13/6596; H01R 4/64; H01R 9/0512; H02B 5/01; H01H 9/12
See application file for complete search history.

(56) References Cited
U.S. PATENT DOCUMENTS 5,414,223 A * 5/1995 Suski .................. H05K 1/0215
174/261
6,493,233 B1 * 12/2002 De Lorenzo .......... H05K 3/325
174/138 G
(Continued)

*Primary Examiner* — Ishwarbhai B Patel
(74) *Attorney, Agent, or Firm* — Andrew C. Cheng

(57) ABSTRACT

A printed circuit board (PCB) is provided. From top to bottom, the PCB sequentially includes: a top layer; an upper solder resist layer; a wiring layer; a lower solder resist layer; a bottom layer; and a hole installation part disposed on the upper solder resist layer, the wiring layer, the lower solder resist layer, and the bottom layer. Wherein, the hole installation part includes a screw hole and a copper exposing region; a copper foil is disposed on the copper exposing region of the upper solder resist layer, the wiring layer, the lower solder resist layer, and the bottom layer; an area of the copper foil is not less than an area of the copper exposing region.

3 Claims, 1 Drawing Sheet

(51) Int. Cl.
  *H05K 3/00* (2006.01)
  *H05K 3/34* (2006.01)
  *H01R 4/64* (2006.01)
  *H01R 12/51* (2011.01)

(52) U.S. Cl.
  CPC ............ *H01R 12/51* (2013.01); *H05K 3/0005* (2013.01); *H05K 3/3452* (2013.01); *H05K 2201/10409* (2013.01)

(56) References Cited

U.S. PATENT DOCUMENTS 6,972,382 B2 * 12/2005 Zollo .................. H05K 3/4623
  174/262
2009/0181563 A1 * 7/2009 Lin ....................... H01R 12/58
  439/92

* cited by examiner

PRINTED CIRCUIT BOARD AND DESIGN METHOD THEREOF

BACKGROUND OF THE INVENTION

1. Field of the Invention

The present invention relates to a printed circuit board, and more particular relates to a printed circuit board having multiple holes and a design method thereof.

2. Description of Related Art

For the electronic industry, a printed circuit board (PCB board) usually has screw holes used for fixing. The number of the screw holes is one or two. For a better connection with the ground, an inner wall of a standard screw hole is usually coated with a layer of conductive metal material. The layer of conductive metal material is connected with the ground through driving a screw at the screw hole in order to reduce the electrostatic discharge (ESD) and the electromagnetic interference (EMI). Through a proof of an experiment, the drawback of above design is that when driving a screw, the screw may damage the inner wall of the screw hole. Because of the damage of the screw hole, the screw is not fixed well so as to affect the use of a product. In order to improve that phenomenon, when design a PCB, an inner wall of a screw hole may not be coated with a layer of conductive metal material as so to expose the PCB substrate. When a PCB designer performs a design, each actual device on a PCB has to correspond to each device drawn on a circuit diagram. This process is called "DECAL" in the PCB industry. Therefore, before design a PCB, a "DECAL" must be built first in order to start the following process.

Currently, a standard PCB usually includes three or more screw holes. A PCB software can not establish a "DECAL". At this time, a PCB designer usually enforces a PAD to overlap (a PAD forcedly overlaps a pin of a device). The above design violates the PCB design rule so as to generate a design rule check (DRC) error. The DRC error can not be removed by the PCB software, and can only be ignored by the PCB designer.

SUMMARY OF THE INVENTION

In order to solve the above problems, the present invention provides a design method for a PCB having multiple screw holes, comprising steps of:

A. sequentially disposing a top layer, an upper solder resist layer, a wiring layer, a lower solder resist layer, a bottom layer, and a hole installation part on the upper solder resist layer, the wiring layer, the lower solder resist layer, and the bottom layer, wherein, the hole installation part includes a screw hole and a copper exposing region; disposing a board-geometry-outline layer and a route keepout layer in the PCB;

B. disposing a first circle on the route keepout layer corresponding to the hole installation part, wherein, the first circle is larger than a cross section of the screw hole;

C. disposing a second circle on the geometry outline layer corresponding to the hole installation part, wherein, the second circle is equal to the cross section of the screw hole; and D. respectively disposing a copper foil on the copper exposing region of the top layer, the upper solder resist layer, the wiring layer, the lower solder resist layer, and the bottom layer, wherein, an area of the copper foil does not less than an area of the copper exposing region.

Wherein, a diameter of the first circle is at least larger than a diameter of the second circle by 0.2 mm.

Wherein, the area of the copper foil is equal to the area of the copper exposing region.

Wherein, in the step D, the copper foil is set in a dynamic state.

Wherein, the copper foil is disposed between the first circle and the second circle.

The present invention also provides a PCB, from a top to a bottom, sequentially comprising: a top layer; an upper solder resist layer; a wiring layer; a lower solder resist layer; a bottom layer; and a hole installation part disposed on the upper solder resist layer, the wiring layer, the lower solder resist layer, and the bottom layer; wherein, the hole installation part includes a screw hole and a copper exposing region; a copper foil is disposed on the copper exposing region of the upper solder resist layer, the wiring layer, the lower solder resist layer, and the bottom layer; an area of the copper foil is not less than an area of the copper exposing region.

Wherein, the area of the copper foil is equal to the area of the copper exposing region.

Wherein, the copper foil is disposed on each surface of the top layer, the upper solder resist layer, the wiring layer, the lower solder resist layer, and the bottom layer.

Wherein, a diameter of the copper exposing region is greater than a diameter of the screw hole by at least 0.2 mm.

The present invention overcomes the deficiencies and defects of the conventional art such that when designing a PCB having multiple screw holes, the current software can not build the DECAL is solved. The time delay because of the communication with the factory is reduced so as to reduce the error rate of the final product in order to increase the yield rate of the product.

DETAILED DESCRIPTION OF THE PREFERRED EMBODIMENT

The following content combines with the drawings and the embodiment for describing the present invention in detail.

Figure 1:
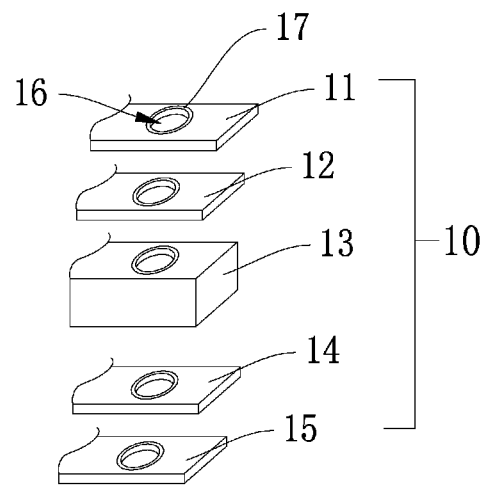
FIG. 1 is schematic diagram of a portion of each layer of a PCB according to an embodiment of the present invention.

The present invention provides a design method for a printed circuit board (PCB) having multiple screw holes. Preferably, the design method is achieved through an ALLEGRO design software, and specifically includes following steps:

A. First of all, running the ALLEGRO design software, and setting a copper foil in a static state. As shown in FIG. 1, in a PCB 10, sequentially disposing a top layer 11, an upper solder resist layer 12, a wiring layer 13, a lower solder resist layer 14, a bottom layer 15, multiple hole installation parts, wherein, each of the hole installation parts includes a screw hole 16 for receiving a screw and a copper exposing regions 17. That is, each of function layers (the top layer 11, the upper solder resist layer 12, the wiring layer 13, the lower solder resist layer 14, and the bottom layer 15) is provided with the screw hole 16 and the copper exposing region 17, and through the overlapping of the function layers to form a complete screw hole of the PCB 10. A circuit and multiple devices (not shown in FIG. 1) are disposed on the PCB 10. In order to make nuts (not shown in FIG. 1) and the PCB 10 form a ground connection, each of the screw holes 16 is provided with the copper exposing region 17 at each function layer, named GND.

B. then, disposing a board-geometry-outline layer (BOARD GEOMETRY OUTLINE, not shown in FIG. 1) and a route keepout layer (ROUTE KEEPOUT ALL, not shown in FIG. 1) in the PCB 10. In the ALLEGRO design software, the board-geometry-outline layer and the route keepout layer can appear in any function layer. For example, the function of the board-geometry-outline layer can use to define an outline of the PCB 10.

C. utilizing the ALLEGRO design and using a center of the screw hole 16 as a center of a circle to dispose a first circle 18 by a way of adding copper foil on the route keepout layer, wherein, the first circle 18 is larger than a cross section of the screw hole 16, and first circle 18 is corresponding to the hole installation part. Disposing the first circle 18 on the route keepout layer is equal to dispose and a specific partition hole installation part on each function layer such that the hole installation part is really distinguished from other devices. An internal region of the first circle 18 is used for disposing the screw hole 16 and the copper exposed area 17. An external region of the first circle 18 is used for let the PCB 10 to normally dispose copper wiring so as to work normally. Through the above design, when performing the step A, the design rule can be satisfied without generating the DRC error. Furthermore, in a preferred embodiment, the diameter of the first circle 18 is larger than the diameter of the cross section of the screw hole 16 by 0.2 mm such that the hole installation part can have enough copper exposed area 17.

Figure 2:
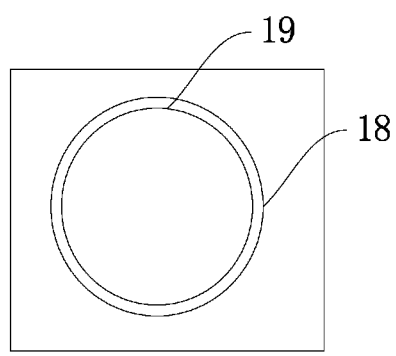
FIG. 2 is schematic diagram of a screw hole of a portion of a top layer of a PCB according to an embodiment of the present invention.

D. utilizing the ALLEGRO design software and using a center of the screw hole 16 as a center of a circle to dispose a second circle 19 by a way of adding a 2D line on the geometry outline layer, wherein, the second circle 19 is equal to a cross section of the screw hole 16, and second circle 19 is corresponding to the hole installation part. As shown in FIG. 2, disposing the second circle 19 on the geometry outline layer is equal to dispose a through hole running through the PCB 10. The aperture of the through hole is the diameter of the second circle 19. The first circle 18 and the second circle 19 are concentric. An internal region of the second circle 19 is used for receiving a screw. A region between the first circle 18 and the second circle 19 can used for disposing a copper foil. For example, the diameter of the second circle 19 is 3.4 mm, that is an actual opening size of the screw hole 16, and preferably, the diameter of the first circle 18 is 3.6 mm.

E. respectively disposing copper foil on the copper exposing regions 17 of the top layer 11, the upper solder resist layer 12, the wiring layer 13, the lower solder resist layer 14, and the bottom layer 15, wherein, the copper foil does not less than the area of the copper exposing region 17. Furthermore, in a preferred embodiment, the copper foil is equal to the area of the copper exposing region 17. In the present embodiment, the copper foil is disposed on a surface of each function layer. The copper foil does not disposed at an inner side wall of the function layer so as to avoid the copper foil from damaging by the rotation of the nuts so as to loose the nuts.

The PCB 10 designed by the ALLEGRO software, the hole installation part is easily designed on the region required to have a screw hole. Too many communications with the factory is not required. A PCB having multiple screw holes can be efficiently and conveniently achieved.

When running the ALLEGRO software using the embodiment of the present invention, and the copper foil is set in a static state, the steps A to D should be performed in order. If the copper foil is set in a dynamic state, the sequence of the steps B to D does not affect the technical effect of the present invention.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A printed circuit board (PCB), from a top to a bottom, sequentially comprising:
    a top layer;
    an upper solder resist layer;
    a wiring layer;
    a lower solder resist layer;
    a bottom layer; and
    a hole installation part disposed on each of the top layer, the upper solder resist layer, the wiring layer, the lower solder resist layer, and the bottom layer;
    wherein, the hole installation part includes a screw hole and a copper exposing region; a copper foil is disposed on the copper exposing region of each of the top layer, the upper solder resist layer, the wiring layer, the lower solder resist layer, and the bottom layer; an area of the copper foil is not less than an area of the copper exposing region; and
    wherein, the copper foil is disposed on a surface of each of the top layer, the upper solder resist layer, the wiring layer, the lower solder resist layer, and the bottom layer, and the copper foil does not disposed at an inner side wall of each of the top layer, the upper solder resist layer, the wiring layer, the lower solder resist layer, and the bottom layer.

2. The PCB according to claim 1, wherein, the area of the copper foil is equal to the area of the copper exposing region.

3. The PCB according to claim 1, wherein, a diameter of the copper exposing region is greater than a diameter of the screw hole by at least 0.2 mm.

\* \* \* \* \*